United States Patent [19]

Jimenez

[11] Patent Number: 5,646,433
[45] Date of Patent: *Jul. 8, 1997

[54] PAD PROTECTION DIODE STRUCTURE

[75] Inventor: Jean Jimenez, Voiron, France

[73] Assignee: SGS Thomson Microelectronics S.A., Saint Genis, France

[ * ] Notice: The term of this patent shall not extend beyond the expiration date of Pat. No. 5,432,368.

[21] Appl. No.: 484,646

[22] Filed: Jun. 7, 1995

Related U.S. Application Data

[63] Continuation of Ser. No. 82,236, Jun. 24, 1993, Pat. No. 5,432,368.

[30] Foreign Application Priority Data

Jun. 25, 1992 [FR] France ................... 92 08280

[51] Int. Cl.$^6$ .................... H01L 29/06; H01L 29/78
[52] U.S. Cl. .................... 257/355; 257/356; 257/362; 257/363; 257/546; 257/603
[58] Field of Search .................... 257/355, 356, 257/357, 362, 363, 546, 603

[56] References Cited

FOREIGN PATENT DOCUMENTS 0401135  12/1990  European Pat. Off. .
58-58768  4/1983  Japan .
60-233846 11/1985  Japan .
1-214055  8/1989  Japan .................... 257/362
1-293560 11/1989  Japan .................... 257/362

OTHER PUBLICATIONS

International Electron Devices Meeting, Dec. 1990, San Francisco, CA, US, pp. 799–802, XP279627, M.P. Masaquelier et al., "Method of Internal Overvoltage Protection and Current Limit for a Lateral PNP Transistor Formed by Polysilicon Self–Aligned Emitter and Base, with Extended Collector."
Patent Abstracts of Japan, vol. 13, No. 220 (E–762) (2528) May 23, 1989, & JP–A–10 32 666 (Mitsubishi) Feb. 2, 1989.

Primary Examiner—J. Carroll
Attorney, Agent, or Firm—Wolf, Greenfield & Sacks, P.C.; James H. Morris

[57] ABSTRACT

A diode structure for protecting a pad in an integrated circuit formed in a P-type substrate coupled between a first supply terminal connected to the substrate and a second supply terminal. The structure includes a P-type pocket whose edges and bottom contact an N-type region, an N-type area formed in the pocket, an N-type ring laterally surrounding the region of the second conductivity type and contacting the substrate, and a P-type well surrounding the ring. The ring and the pocket are connected to the pad, the N-type area formed in the pocket is connected to the second supply terminal and the well is connected to the first supply terminal.

9 Claims, 1 Drawing Sheet

PAD PROTECTION DIODE STRUCTURE

This application is a continuation of application Ser. No. 08/082,236, filed Jun. 24, 1993, entitled PAD PROTECTION DIODE STRUCTURE, now U.S. Pat. No. 5,432,368.

BACKGROUND OF THE INVENTION

1. Field of the Invention

The present invention relates to the protection of integrated circuit pads against electrostatic discharges.

2. Discussion of the Related Art

As is known, an integrated circuit is connected to external circuits through input and output pads, which are in turn connected to pins. The internal components of integrated circuits are generally sensitive to electrostatic overvoltages that are capable of destroying them. Generally, each integrated circuit pad is connected to an electrostatic discharge protection circuit, a schematic example of which is illustrated in the drawing of FIG. 1.

FIG. 1 schematically shows a pad connected, by way of example, to the input gate of a MOS transistor. The integrated circuit is coupled between a high supply voltage VDD and a low supply voltage VSS, for example, ground. The pad is connected to the low and high voltage terminals through biased diodes D1 and D2, as shown in FIG. 1. Thus, if the pad becomes more negative than VSS (minus a forward diode voltage drop), the overvoltage passes through diode D1 and is absorbed by VSS. If the pad becomes more positive than VDD (plus a forward diode voltage drop), the overvoltage passes through diode D2 and is absorbed by VDD. In both cases, the device connected to the pad, for example a MOS transistor, is protected.

The invention is more particularly directed to a technology such as the one, for example, used for realizing bipolar and MOS (BICMOS) dual integrated circuits using a substrate of a first conductivity type coated with an epitaxial layer of the second conductivity type. Such technology comprises means to form, at the interface between the substrate and the epitaxial layer, N or P-type buried layers and means to form, in the epitaxial layer, pockets of the first conductivity type and, of course, various N or P-type doped regions in the pockets and in the substrate from the integrated circuit surface.

FIGS. 2 and 3 show conventional structures used in the prior art to fabricate diodes D1 and D2, respectively, of FIG. 1 when the substrate 1 is of the P-type and the epitaxial layer 2 is of the N-type.

FIG. 2 schematically shows a conventional implementation of diode D1 of FIG. 1. Diode D1 is formed in a P-type pocket 3 contacting by its lower surface a highly doped buried P-type layer 4. From the surface of the pocket are formed a first N-type region 6 and a second P-type region 7. Region 7 is, for example, an annular region surrounding region 6. Region 7, which electrically contacts substrate 1 through pocket 3 and buried layer 4, is necessarily polarized at the substrate voltage, that is, the low voltage VSS. Region 6 is connected to the pad. Thus, diode D1 is formed at the junction between pocket 3 and region 6 as shown in FIG. 2 Additionally, outside the pocket, is represented a portion 10 of the epitaxial layer 2 and an $N^+$-type ring formed by a buried layer 8 and a $N^+$-type deep diffusion 9; the upper surface of region 9 is covered by a metallization connected to the high voltage VDD. The ring formed by layer 8 and diffusion 9 is used for polarizing the portion 10 of the epitaxial layer which constitutes the collector of an NPN transistor whose emitter-base junction corresponds to diode D1 and that collects the charges transmitted when diode D1 is conductive.

Additionally, the structure is surrounded by a substrate contact, such as described hereinafter with reference to FIG. 3, for isolating the portion 10 of the epitaxial layer and the $N^+$-type ring 8–9.

FIG. 3 schematically shows an exemplary conventional implementation of diode D2 of FIG. 2. Diode D2 is formed in a portion 11 of the epitaxial layer 2 beneath which is formed an N+-type buried layer 12. An $N^+$-type diffused ring 13 contacts the buried layer 12 and insulates portion 11. A $P^+$-type region 14 is diffused in the portion of layer 11. Region 14 is connected to the pad and the upper surface of region 13 is connected to voltage VDD. Thus, diode D2 is formed at the junction between region 14 and the portion of N-type layer 11. At the periphery of the above-described structure is shown a substrate contact, that is, a $P^+$-type buried layer 15 contacted by a P-type diffusion 16 at the surface of which is formed a $P^+$-type diffused region 17 integral with a substrate polarization contact connected to voltage VSS. This substrate contact forms the collector of a PNP transistor whose emitterbase junction corresponds to diode D2 and which collects the charges transmitted when the diode is conductive.

FIG. 3 is shown separately from FIG. 2 although in practice the two diodes D1 and D2 are formed on a single integrated circuit and can be adjacent.

SUMMARY OF THE INVENTION

The invention is directed to a structure combining the above-described diodes D1 and D2 and to reduce the occupied surface.

Another object of the invention is to provide such a structure compatible with the conventional technological steps of an integrated circuit such as a BICMOS integrated circuit.

Those objects are achieved by providing a diode structure for the protection of a pad against electrostatic discharges in an integrated circuit formed in a substrate of a first conductivity type and coupled between a first supply terminal connected to the substrate and a second supply terminal. This structure includes a pocket of the first conductivity type whose edges and bottom are surrounded by a region of the second conductivity type, the bottom of which contacts the substrate, an area of the second conductivity type formed in the pocket, a ring of the second conductivity type laterally surrounding the region of the second conductivity type and contacting the substrate, and a well contacting the substrate, surrounding the ring. A first contact is formed with the ring, a second contact is formed with the pocket, a third contact with the area formed in the pocket, and a fourth contact with the well. The first and second contacts are connected to the pad, the third contact to the second supply terminal, and the fourth to the first supply terminal.

According to an embodiment of the invention, the pocket bottom is formed by a first portion of an highly doped buried layer of the first conductivity type formed in a second portion of the low doped buried layer of the second conductivity type, sandwiched between the first buried layer and the substrate.

According to an embodiment of the invention, the substrate is coated with an epitaxial layer of the second conductivity type in which is formed the pocket, a portion of the epitaxial layer remaining between the pocket and the ring.

The foregoing and other objects, features, aspects and advantages of the invention will become apparent from the

BRIEF DESCRIPTION OF DRAWINGS

FIGS. 2, 3 and 4 are schematic cross-sectional views of integrated circuits and are not drawn to scale. Additionally, the edges of some layers are shown for the sake of simplification with right angles whereas, as is known by those skilled in the art, the diffusion and annealing steps form rounded up edges.

DETAILED DESCRIPTION

The invention provides for forming an assembly of two diodes D1 and D2 in which diode D2 is formed in a P pocket insulated by an N-type region entirely surrounding it. In fact, it is known from the BICMOS technological steps such as described, for example, in the European patent application 401,135 filed by the applicant in the name of the same inventor, to provide a low doped N-type buried layer that can be formed beneath a P$^+$-type buried layer. Thus, the formation of the N-type layer entirely insulating the P pocket used according to the invention does not involve the implementation of new technological steps with respect to the conventional technological steps used in BICMOS technology.

Figure 4:
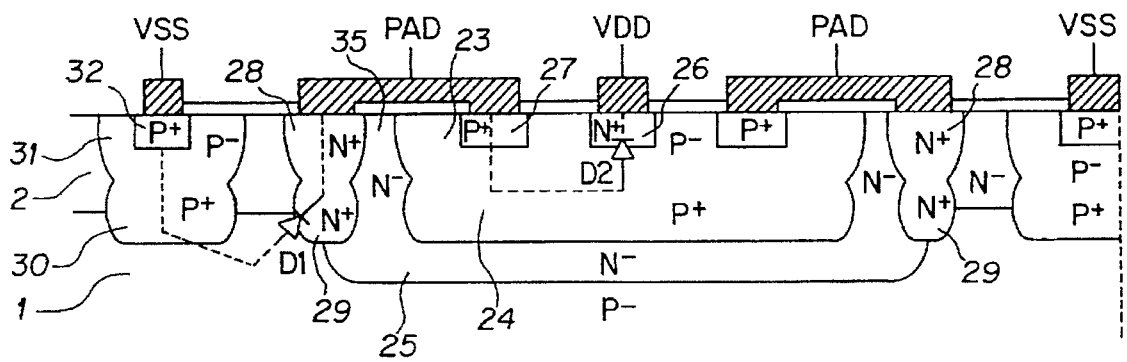
FIG. 4 is a cross-sectional view of a diode structure for the protection of an integrated circuit pad according to the invention.

More particularly, FIG. 4 shows a portion of an integrated circuit formed in a P-type substrate 1 above which is formed an N-type epitaxial layer 2. In the epitaxial layer 2 is formed a P-type pocket 23 contacting a P$^+$-type buried layer 24. Layer 24 is in turn formed above an N$^-$-type buried layer 25 which has an interface with substrate 1. In pocket 23 are formed N-type regions 26 and P-type regions 27. At the periphery of pocket 23 is formed an N-type wall or ring formed by a portion of the N$^+$-type buried layer 29 and a deep diffused region 28 that contacts this buried layer portion. At the outside of the device is provided a substrate contacting well including a P$^+$-type buried region 30 contacted by a P-type deep diffusion 31 in which are formed more highly doped P-type contact regions 32.

The pad is connected to metallizations contacting region 27 and the upper portion 28 of the N-type wall. Of course, the substrate contact is connected to voltage VSS to ensure the substrate polarization, and the N$^+$-type region 26 of the pocket is connected to voltage VDD. With the invention, pocket 23, that is entirely surrounded by the N-type region formed by the buried layer 25 and a portion 35 of the epitaxial layer 2 can be set to a selected voltage and is no longer necessarily connected to voltage VSS, as in the example shown in FIG. 2. With this structure, diode D2 is formed at the junction between the N$^+$-type region 26 and the P-type pocket 23, and diode D1 is formed at the junction between the N-type wall 28–29 and substrate 1. Dotted lines schematically show in the various drawings the current flow paths through diodes D1 and D2.

Figure 1:
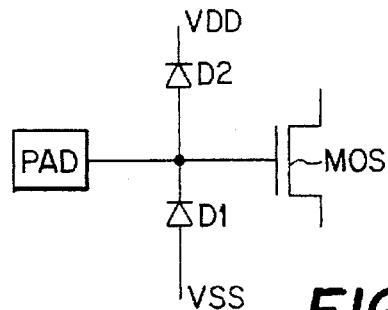
FIGS. 1–3, above described, are useful for illustrating the problem encountered and the prior art solutions.
Figure 2:
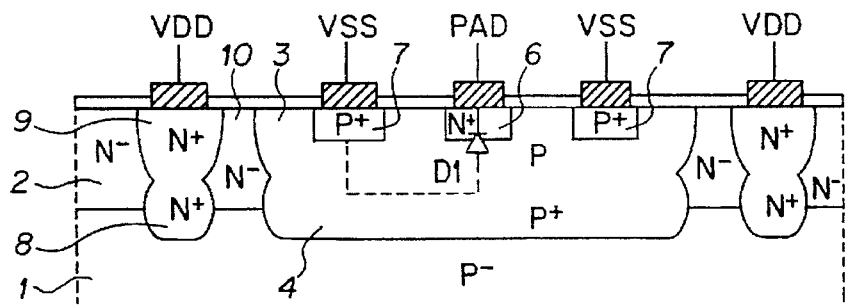
Figure 3:
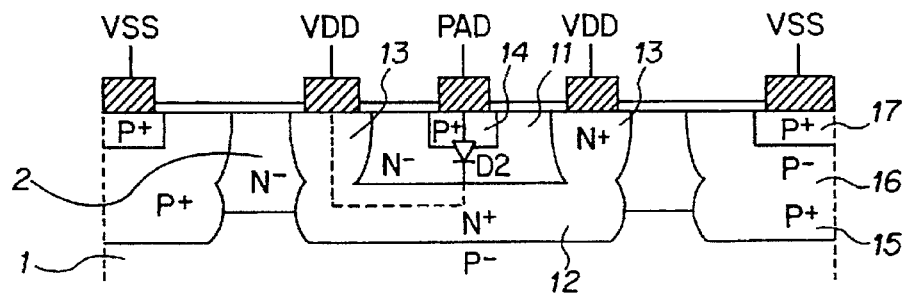

Thus, with the invention, diodes D1 and D2 are formed in a surface that is not larger than that used in the prior art for forming the single diode D1, as can be seen by comparing FIGS. 2 with 4, keeping in mind that in FIG. 2 the structure is surrounded by a substrate contact (not shown).

Although described as part of a specific technology, the invention applies to other technologies, for example in technologies where all the conductivity types of semiconductor materials and the applied voltage polarities are reversed.

As is apparent to those skilled in the art, various modifications can be made to the above-disclosed preferred embodiment; in particular, cross-sectional views of protection structures only are shown. Conventionally, the various regions and rings are rectangular.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A diode structure for protecting an integrated circuit formed in a substrate of a first conductivity type, said integrated circuit being coupled between a pad and first and second supply terminals, said diode structure comprising:

a pocket of said first conductivity type;

a lowly doped region of a second conductivity type disposed between the substrate and said pocket;

an first area of said second conductivity type formed in said pocket, said area being coupled to the second supply terminal;

a second area of said first conductivity type formed in said pocket and coupled to said pad;

a ring of said second conductivity type being disposed around said pocket and coupled to said substrate, said ring being further coupled to said pad; and a well of said first conductivity type coupled to said substrate and being disposed around said ring, said well being further coupled to the first terminal.

2. The diode structure of claim 1, wherein the pocket includes:

a lowly doped portion disposed between said first and second areas; and a highly doped portion disposed between said lowly doped portion and said lowly doped region.

3. The diode structure of claim 1, further including an epitaxial layer of said second conductivity type said pocket being formed in said epitaxial layer, said epitaxial layer having a portion disposed between said pocket and said well.

4. A diode structure for protecting a pad against electrostatic discharges in an integrated circuit formed in a substrate of a first conductivity type, the integrated circuit being coupled between a first supply terminal connected to the substrate and a second supply terminal, said diode structure including:

a pocket of the first conductivity type having edges and a bottom that contact a lowly doped region of a second conductivity type and wherein the lowly doped region further contacts the substrate;

an area of the second conductivity type formed in the pocket;

a ring of the second conductivity type laterally surrounding the pocket and contacting the substrate;

a well of the first conductivity type contacting the substrate and surrounding the ring;

a first contact with the ring;

a second contact with the pocket;

a third contact with the area;

a fourth contact with the well;

means for connecting the first and second contacts to the pad;

means for connecting the third contact to the second supply terminal; and means for connecting said fourth contact to the first supply terminal.

5. The protection diode structure of claim 4, wherein the bottom of the pocket is formed by a first portion of a highly doped buried layer of the first conductivity type formed in a second portion of a low doped buried layer of the second conductivity type sandwiched between the first buried layer and the substrate.

6. The protection diode structure of claim 4, wherein the substrate is coated with an epitaxial layer of the second conductivity type in which is formed the pocket, a portion of said epitaxial layer remaining between the pocket and the well.

7. A diode structure for protecting a pad against electrostatic discharges in an integrated circuit formed in a substrate of a first conductivity type, said diode structure comprising:

a pocket of the first conductivity type having at least one edge and a bottom that contact a region of a second conductivity type and wherein the lowly doped region further contacts the substrate;

an area of the second conductivity type formed in the pocket;

a ring of the second conductivity type laterally surrounding the pocket and contacting the substrate;

a well of the first conductivity type contacting the substrate and surrounding the ring;

a first contact with the ring;

a second contact with the pocket;

a third contact with the area;

a fourth contact with the well;

a first metallization for connecting the first and second contacts to the pad;

a second metallization for connecting the third contact to a second supply terminal; and a third metallization for connecting the fourth contact to a first supply terminal.

8. The diode structure of claim 7, wherein the bottom of the pocket is formed by a first portion of a highly doped buried layer of the first conductivity type formed in a second portion of a low doped buried layer of the second conductivity type disposed between the first buried layer and the substrate.

9. The diode structure of claim 7, wherein the substrate is coated with an epitaxial layer of the second conductivity type in which is formed the pocket, a portion of the epitaxial layer remaining between the pocket and the well.

* * * * *